(12) United States Patent
Yamaguchi

(10) Patent No.: US 8,987,912 B2
(45) Date of Patent: Mar. 24, 2015

(54) SEMICONDUCTOR DEVICE AND METHOD OF MANUFACTURING THE SAME

(75) Inventor: Yoshihiro Yamaguchi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 1032 days.

(21) Appl. No.: 13/020,235

(22) Filed: Feb. 3, 2011

(65) Prior Publication Data

US 2011/0266686 A1    Nov. 3, 2011

(30) Foreign Application Priority Data

Apr. 28, 2010  (JP) .................................. 2010-103508

(51) Int. Cl.
*H01L 23/02* (2006.01)
*H01L 23/52* (2006.01)
(Continued)

(52) U.S. Cl.
CPC ........ *H01L 23/3107* (2013.01); *H01L 23/3735* (2013.01); *H01L 23/4334* (2013.01);
(Continued)

(58) Field of Classification Search
CPC .............. H01L 2924/00; H01L 2224/73265; H01L 2224/32225; H01L 2224/48227; H01L 2224/48091; H01L 2224/49109; H01L 2224/48247; H01L 2224/45124; H01L 2224/04105; H01L 2924/00014; H01L 2924/13055; H01L 2924/3512; H01L 2924/01013; H01L 2924/01014; H01L 2924/010129; H01L 2924/014; H01L 2924/1815; H01L 2924/19107; H01L 2924/181; H01L 2924/18301; H01L 23/3107; H01L 23/3735; H01L 23/4334; H01L 23/49531; H01L 23/49811; H01L 23/00; H01L 23/48; H01L 23/482; H01L 23/28; H01L 23/31; H01L 24/01; H01L 24/29; H01L 24/32; H01L 24/45; H01L 24/48; H01L 24/49; H01L 24/72; H01L 24/73; H01L 29/7302; H01L 21/56; H01L 2225/06548
USPC .................. 257/688, 691, 692, 693, 706, 773
See application file for complete search history.

(56) References Cited

U.S. PATENT DOCUMENTS 3,649,738 A * 3/1972 Andersson et al. .......... 174/15.1
6,548,890 B2 * 4/2003 Miyake et al. ................ 257/688
(Continued)

FOREIGN PATENT DOCUMENTS

CN          101399238 A      4/2009
DE   10 2008 008 141 A1     8/2008
(Continued)

OTHER PUBLICATIONS

Office Action issued Jan. 21, 2014, in Japanese Patent Application No. 2010-103508 with English translation.
(Continued)

*Primary Examiner* — Teresa M Arroyo
(74) *Attorney, Agent, or Firm* — Oblon, McClelland, Maier & Neustadt, L.L.P.

(57) ABSTRACT

A semiconductor device includes a substrate having a conductor; a semiconductor chip disposed on the substrate and electrically connected to the conductor; a tubular electrode having one end electrically connected to the conductor; and a sealing resin sealing the substrate, the semiconductor chip and the electrode. The electrode is configured to be extendable and contractible in the stacking direction in which the substrate and the semiconductor chip are stacked in the state before sealing of the sealing resin. The edge of the other end of the electrode is exposed from the sealing resin. The electrode has a hollow space opened at the edge of the other end. Therefore, a semiconductor device reduced in size and a method of manufacturing this semiconductor device can be provided.

7 Claims, 4 Drawing Sheets

(51) Int. Cl.
*H01L 23/48* (2006.01)
*H01L 23/10* (2006.01)
*H01L 23/34* (2006.01)
*H01L 29/40* (2006.01)
*H01L 23/31* (2006.01)
*H01L 23/373* (2006.01)
*H01L 23/433* (2006.01)
*H01L 23/495* (2006.01)
*H01L 23/498* (2006.01)
*H01L 23/00* (2006.01)

(52) U.S. Cl.
CPC .... *H01L23/49531* (2013.01); *H01L 23/49811* (2013.01); *H01L 24/01* (2013.01); *H01L 24/72* (2013.01); *H01L 24/73* (2013.01); *H01L 24/29* (2013.01); *H01L 24/32* (2013.01); *H01L 24/45* (2013.01); *H01L 24/48* (2013.01); *H01L 2224/32225* (2013.01); *H01L 2224/45124* (2013.01); *H01L 2224/48091* (2013.01); *H01L 2224/48227* (2013.01); *H01L 2224/48247* (2013.01); *H01L 2224/49109* (2013.01); *H01L 2224/73265* (2013.01); *H01L 2924/01013* (2013.01); *H01L 2924/01014* (2013.01); *H01L 2924/01029* (2013.01); *H01L 2924/01033* (2013.01); *H01L 2924/01082* (2013.01); *H01L 2924/014* (2013.01); *H01L 2924/19107* (2013.01); *H01L 24/49* (2013.01); *H01L 2924/01005* (2013.01); *H01L 2924/01006* (2013.01); *H01L 2924/01042* (2013.01); *H01L 2924/01068* (2013.01); *H01L 2924/1815* (2013.01); *H01L 2924/13055* (2013.01)
USPC .......... 257/773; 257/688; 257/691; 257/692; 257/693; 257/706

(56) References Cited

U.S. PATENT DOCUMENTS

| 2004/0007772 | A1* | 1/2004 | Arai et al. ............... 257/691 |
| 2005/0280490 | A1* | 12/2005 | Uchiyama et al. ......... 336/90 |
| 2007/0200146 | A1 | 8/2007 | Onishi et al. |
| 2009/0086449 | A1 | 4/2009 | Minamio et al. |
| 2009/0160048 | A1* | 6/2009 | Nakatsu et al. ........... 257/714 |
| 2010/0013086 | A1 | 1/2010 | Obiraki et al. |
| 2010/0117219 | A1* | 5/2010 | Oka et al. ................ 257/693 |
| 2011/0049531 | A1 | 3/2011 | Oka et al. |

FOREIGN PATENT DOCUMENTS

| DE | 11 2008 000 229 T5 | 12/2009 | |
| DE | 10 2009 032 973 A1 | 1/2010 | |
| DE | 10 2008 029 829 A1 | 3/2010 | |
| DE | 10 2009 042 399 A1 | 10/2010 | |
| JP | 04326580 A * | 11/1992 | ............. H01L 41/09 |
| JP | 9-283681 | 10/1997 | |
| JP | 11-74422 | 3/1999 | |
| JP | 2004-165281 | 6/2004 | |
| JP | 2005-302778 | 10/2005 | |
| JP | 2007-184315 A | 7/2007 | |
| JP | 2010-27813 | 2/2010 | |
| JP | 2010-129818 A | 6/2010 | |
| JP | 2010-186953 | 8/2010 | |
| WO | WO 2007/132612 A1 | 11/2007 | |
| WO | WO 2008/090734 A1 | 7/2008 | |

OTHER PUBLICATIONS

U.S. Appl. No. 13/008,470, filed Jan. 18, 2011, Yamaguchi, et al.
Japanese Office Action issued Feb. 26, 2013, in Patent Application No. 2010-103508 (with English-language translation).
German Office Action issued Oct. 15, 2012, in German Patent Application No. 10 2011 017 585.7.
Office Action issued Sep. 23, 2014 in German Patent Application No. 10 2011 017 585.7 (with English language translation).

* cited by examiner

RELATED ART

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device, and particularly to a semiconductor device sealed with a sealing resin and a method of manufacturing the semiconductor device.

2. Description of the Background Art

Semiconductor devices are generally configured such that a chip, a lead and the like are transfer-molded (transfer molding) with resin. An example of the semiconductor device includes a power semiconductor module used for a power converter and the like for controlling the electrical equipment such as a motor. In the power semiconductor module, an IGBT (Insulated Gate Bipolar Transistor) for controlling the current for supplying a load, a power semiconductor chip serving as a reflux diode, a substrate for insulation, a base board for cooling, and an electrode for application are transfer-molded with resin for modularization.

For example, Japanese Patent Laying-Open No. 2004-165281 discloses a mold resin sealing type power semiconductor device having a housing in which a power semiconductor chip and the like are sealed with mold resin. The power semiconductor chip is fixed by a solder layer to a heat sink within the housing having a side through which the first lead frame fixed to the heat sink protrudes to the outside. Furthermore, the second lead frame electrically connected to the power semiconductor chip via metal wiring protrudes through the side of the housing to the outside.

In transfer molding, a sealing resin is injected in the state where upper and lower dies are brought into contact with and hermetically sealed to each other under a high pressure. This requires accuracy in the dies in order to improve the airtightness of the upper and lower dies. However, it is difficult to set the dimensional tolerance of the components of the semiconductor device in contact with the upper and lower dies to fall within the range of the accuracy of the dies. Accordingly, the electrode of the semiconductor device is removed in the direction in which the electrode is not brought into contact with the upper and lower dies.

Also in the mold resin sealing type power semiconductor device disclosed in the above-mentioned document, the first and second lead frames protrude to the outside through the side of the housing sealed with mold resin. In the space for the first and second lead frames protruding through the side of this housing to the outside, other semiconductor devices and the like cannot be disposed. Accordingly, the space for the first and second lead frames protruding to the outside through the side of this housing serves as an electrode removing portion which corresponds to an unused area in which other semiconductor devices and the like cannot be disposed in the case where a plurality of semiconductor devices are arranged in parallel.

SUMMARY OF THE INVENTION

The present invention has been made in light of the above-described problems. An object of the present invention is to provide a semiconductor device reduced in size and a method of manufacturing the semiconductor device.

A semiconductor device according to the present invention includes a substrate having a conductor; a semiconductor chip disposed on the substrate and electrically connected to the conductor; a tubular electrode having one end electrically connected to the conductor; and a sealing resin sealing the substrate, the semiconductor chip and the electrode. The electrode is configured to be extendable and contractible in a stacking direction in which the substrate and the semiconductor chip are stacked in a state before sealing of the sealing resin. An edge of an other end of the electrode is exposed from the sealing resin. The electrode has a hollow space opened at the edge of the other end.

According to the semiconductor device of the present invention, since the electrode is configured to be extendable and contractible in the stacking direction in which the substrate and the semiconductor chip are stacked in the state before sealing of the sealing resin, extension and contraction of the electrode in the stacking direction allows absorption of the dimensional tolerance of the substrate, the semiconductor chip or the like in the stacking direction. Furthermore, the electrode is provided in the stacking direction, which prevents the electrode from protruding through the side of the sealing resin to the outside. Consequently, the semiconductor device can be reduced in size.

In addition, the electrode does not protrude through the side of the sealing resin to the outside, which prevents occurrence of the unused area in which other semiconductor devices cannot be disposed due to existence of the electrode. Therefore, when a plurality of semiconductor devices are arranged in parallel, these semiconductor devices can be arranged in a small space, which allows reduction in size of the system (product) including a plurality of semiconductor devices.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 7A, 7B and 7C each are a schematic diagram showing the state where the electrode of the semiconductor device in one embodiment of the present invention is transfer-molded with resin, in which FIG. 7A is a diagram showing the state during setting, FIG. 7B is a diagram showing the state during die clamping, and FIG. 7C is a diagram showing the state during filling with resin.

DESCRIPTION OF THE PREFERRED EMBODIMENTS

One embodiment of the present invention will be hereinafter described with reference to the drawings.

The configuration of the semiconductor device according to one embodiment of the present invention will be first described. With regard to the configuration of the semiconductor device, a transfer-mold type power semiconductor device is described by way of example.

Figure 1:
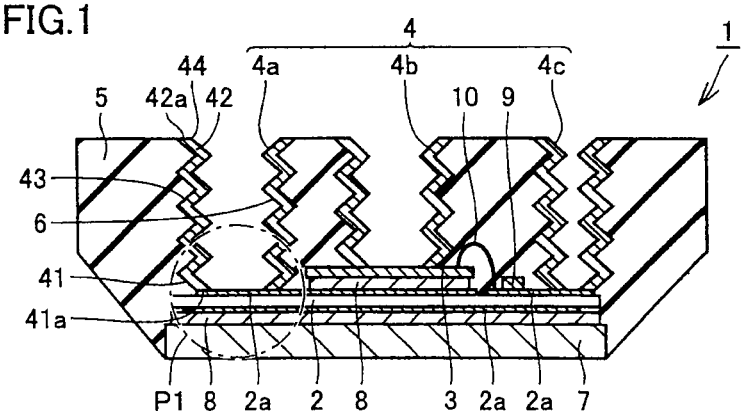
FIG. 1 is a conceptual diagram schematically showing the cross section of a semiconductor device in one embodiment of the present invention.
Figure 2:
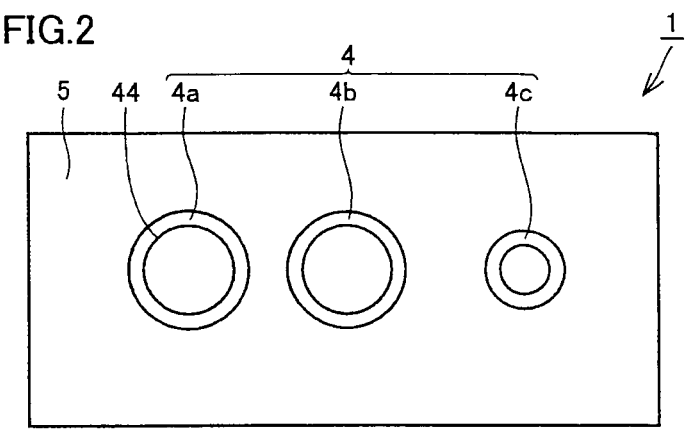
FIG. 2 is a conceptual diagram schematically showing the upper surface of the semiconductor device in one embodiment of the present invention.

Referring to FIGS. 1 and 2, a semiconductor device 1 mainly includes a substrate 2, a semiconductor chip 3, an electrode 4, a sealing resin 5, and a heat spreader 7. Semiconductor device 1 is formed by transfer molding, in which substrate 2, semiconductor chip 3, electrode 4, heat spreader 7 and the like are sealed with sealing resin 5.

Substrate 2 has one surface and the other surface each provided with a conductor 2a which is formed, for example, of a metal pattern. On the one surface side of substrate 2, semiconductor chip 3 is disposed on a part of conductor 2a with solder 8 interposed therebetween. Semiconductor chip 3 is electrically connected to conductor 2a. This semiconductor chip 3 has a switching semiconductor and a diode, for example.

On the one surface side of substrate 2, tubular electrode 4 is disposed on conductor 2a. Electrode 4, for example, has a collector (C) electrode 4a, an emitter (E) electrode 4b and a gate (G) electrode 4c.

For example, semiconductor chip 3 is solder-bonded onto conductor 2a that is solder-bonded to C electrode 4a. Furthermore, semiconductor chip 3 is electrically connected by a wire (not shown) to conductor 2a to which E electrode 4b is solder-bonded. Furthermore, a gate resistance 9 is electrically connected to conductor 2a to which G electrode 4c is solder-bonded. Semiconductor chip 3 is electrically connected via a wire 10 to gate resistance 9. This wire 10 is an aluminum (Al) wire, for example.

Tubular electrode 4 has a longitudinal direction in the stacking direction in which substrate 2 and semiconductor chip 3 are stacked. Electrode 4 is configured to be extendable and contractible in the stacking direction in which substrate 2 and semiconductor chip 3 are stacked in the state before sealing of sealing resin 5. Electrode 4 is configured such that it is sandwiched for contraction between the dies in the state before sealing with sealing resin 5 and also prevented from being extended after solidification of sealing resin 5. Electrode 4 is made, for example, of metal having a low resistance. This metal may be copper or aluminum, for example.

Electrode 4 may have a curved contour portion 43 in a region which is in contact with sealing resin 5. For example, electrode 4 may have a shape of bellows in the region which is in contact with sealing resin 5. Curved contour portion 43 may be bent or may have a smooth curved surface. The inner angle of curved contour portion 43 may be an acute angle or an obtuse angle. The number of curved contour portions 43 may be one or plural.

Figure 3:
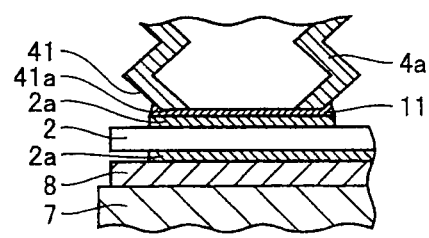
FIG. 3 is an enlarged view schematically showing a P1 area in FIG. 1.

Electrode 4 has one end 41 electrically connected to conductor 2a. Referring to FIG. 3, one end 41 may be electrically connected to conductor 2a by solder bonding with a solder 11. Furthermore, one end 41 may be configured to have a diameter which is reduced toward conductor 2a to an edge 41a of one end 41. Solder 11 is sandwiched between edge 41a of one end 41 and conductor 2a. Furthermore, solder 11 protrudes and extend to the outer periphery of one end 41.

Again referring to FIGS. 1 and 2, the other end 42 of electrode 4 has an edge 42a that is not covered with sealing resin 5 but exposed. Electrode 4 has a hollow space 6 that is opened at edge 42a of the other end 42. Hollow space 6 is provided on the inner periphery side of tubular electrode 4. The other end 42 of electrode 4 may be configured to have a diameter which is increased toward an opening 44 of hollow space 6 to edge 42a of the other end 42.

Furthermore, electrode 4 may be configured to be extendable and contractible in the stacking direction by the force less than the bending strength of substrate 2 in the state before sealing of sealing resin 5. In this case, the configuration is made such that the force required for contraction of electrode 4 is less than the bending strength of substrate 2 at the time of clamping by the dies in the state before sealing with sealing resin 5. This bending strength is, for example, approximately 40 MPa.

Furthermore, electrode 4 may be configured to prevent sealing resin 5 from flowing through opening 44 into hollow space 6 by the injection pressure at the time of sealing of sealing resin 5. In this case, electrode 4 is configured so as to prevent edge 42a of the other end 42 of electrode 4 from being separated from the dies by the injection pressure of sealing resin 5 at the time of sealing with sealing resin 5. This injection pressure is, for example, approximately 10 MPa.

Furthermore, sealing resin 5 may be sealed so as to attain the state where electrode 4 is contracted in the stacking direction within the elastic region. In this case, electrode 4 is configured to be contracted in the stacking direction in the state of sealing with sealing resin 5.

Furthermore, on the other surface side of substrate 2, heat spreader 7 is disposed below conductor 2a with solder 8 interposed therebetween. The undersurface of heat spreader 7 is not covered with sealing resin 5. This heat spreader 7 is made, for example, of Cu (copper), AlSiC (aluminum silicon carbide), Cu (copper)-Mo (molybdenum), and the like.

Then, substrate 2, semiconductor chip 3, electrode 4, heat spreader 7, gate resistance 9, and wire 10 are sealed with sealing resin 5 between edge 42a of the other end 42 of electrode 4 and the bottom of heat spreader 7. Sealing resin 5 is formed such that edge 42a of the other end 42 of electrode 4 and the bottom of heat spreader 7 are exposed.

Then, the description will be made with regard to the state where the semiconductor device according to one embodiment of the present invention is mounted on the printed circuit board. It is to be noted that this semiconductor device is different in details of the configuration from the above-described semiconductor device.

Figure 4:
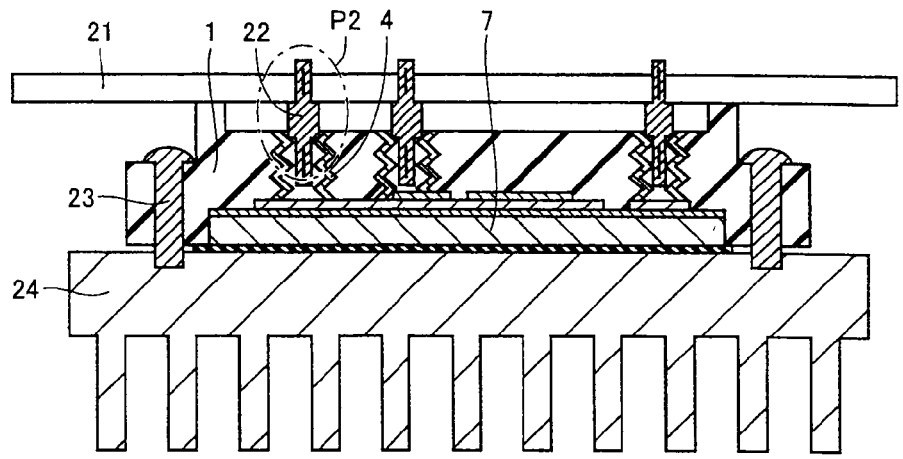
FIG. 4 is a conceptual diagram schematically showing the state where the semiconductor device in one embodiment of the present invention is mounted in a printed circuit board.

Referring to FIG. 4, semiconductor device 1 is electrically connected to a printed circuit board 21 via a relay terminal 22 that is inserted into electrode 4. Semiconductor device 1 is also connected to a cooling fin 24 through a screw 23. An adhesive is applied between heat spreader 7 of semiconductor device 1 and cooling fin 24. It is to be noted that the wire is not shown in FIG. 4.

Then, the method of electrically connecting semiconductor device 1 and printed circuit board 21 via relay terminal 22 will be described.

Figure 5:
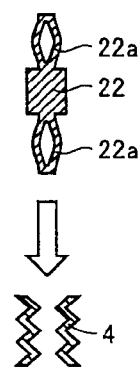
FIG. 5 is a conceptual diagram schematically showing the state where a relay terminal is inserted into an electrode of the semiconductor device in one embodiment of the present invention.
Figure 6:
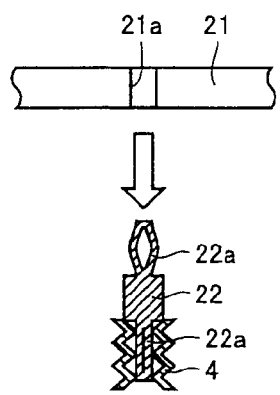
FIG. 6 is a conceptual diagram schematically showing the state where the relay terminal inserted into the electrode of the semiconductor device in one embodiment of the present invention is inserted into a through hole of the printed circuit board.

Referring to FIG. 5, relay terminal 22 is provided at each end thereof with an insertion portion 22a having a hollow portion. Relay terminal 22 has conductivity. Insertion portion 22a is configured such that it is elastically deformable. When relay terminal 22 is moved in the direction indicated by an arrow shown in the figure, insertion portion 22a on the one side is inserted into electrode 4 of semiconductor device 1. Referring to FIG. 6, in the state where insertion portion 22a on the one side is inserted into electrode 4, insertion portion 22a on the one side is pressed against the inner peripheral wall of electrode 4, thereby causing contraction of the hollow portion of insertion portion 22a on the one side. Consequently, relay terminal 22 is firmly held in electrode 4.

Then, printed circuit board 21 is moved in the direction indicated by the arrow shown in the figure, so that insertion portion 22a on the other side is inserted into a through hole 21a of printed circuit board 21. When insertion portion 22a on the other side is inserted into through hole 21a of printed circuit board 21, insertion portion 22a on the other side is pressed against the inner peripheral wall of through hole 21a, thereby causing contraction of the hollow portion of insertion portion 22a on the other side. Consequently, relay terminal 22 is firmly held in printed circuit board 21. In this way, semiconductor device 1 and printed circuit board 21 are electrically connected and firmly attached to each other by relay terminal 22.

Then, the method of manufacturing the semiconductor device according to one embodiment of the present invention will be described.

Referring to FIG. 1 and FIGS. 7A to 7C, semiconductor chip 3 is disposed on substrate 2 including conductor 2a so as to be electrically connected to conductor 2a. Tubular electrode 4 is extendable and contractible in the stacking direction in which substrate 2 and semiconductor chip 3 are stacked. This tubular electrode 4 is disposed such that one end 41 of electrode 4 is electrically connected to conductor 2a. Gate resistance 9 is disposed so as to be electrically connected to semiconductor chip 3 via wire 10. Heat spreader 7 is disposed so as to be electrically connected to conductor 2a.

Substrate 2, semiconductor chip 3, electrode 4, heat spreader 7, and the like are sandwiched between an upper die 31 and a lower die 32 (a pair of dies) from either side of the stacking direction. Consequently, the other end 42 of electrode 4 is pressed with upper die 31, so that electrode 4 is contracted in the stacking direction.

In the state where upper die 31 and lower die 32 are brought into contact and hermetically sealed with each other with a high pressure, sealing resin 5 is injected into upper die 31 and lower die 32 (a pair of dies), for sealing of substrate 2, semiconductor chip 3, electrode 4, heat spreader 7, and the like with sealing resin 5. Filling and pressurization of sealing resin 5 lead to transfer molding of semiconductor device 1.

Then, the description will be made with regard to electrode 4 in the state of sealing with sealing resin 5.

Figure 7:
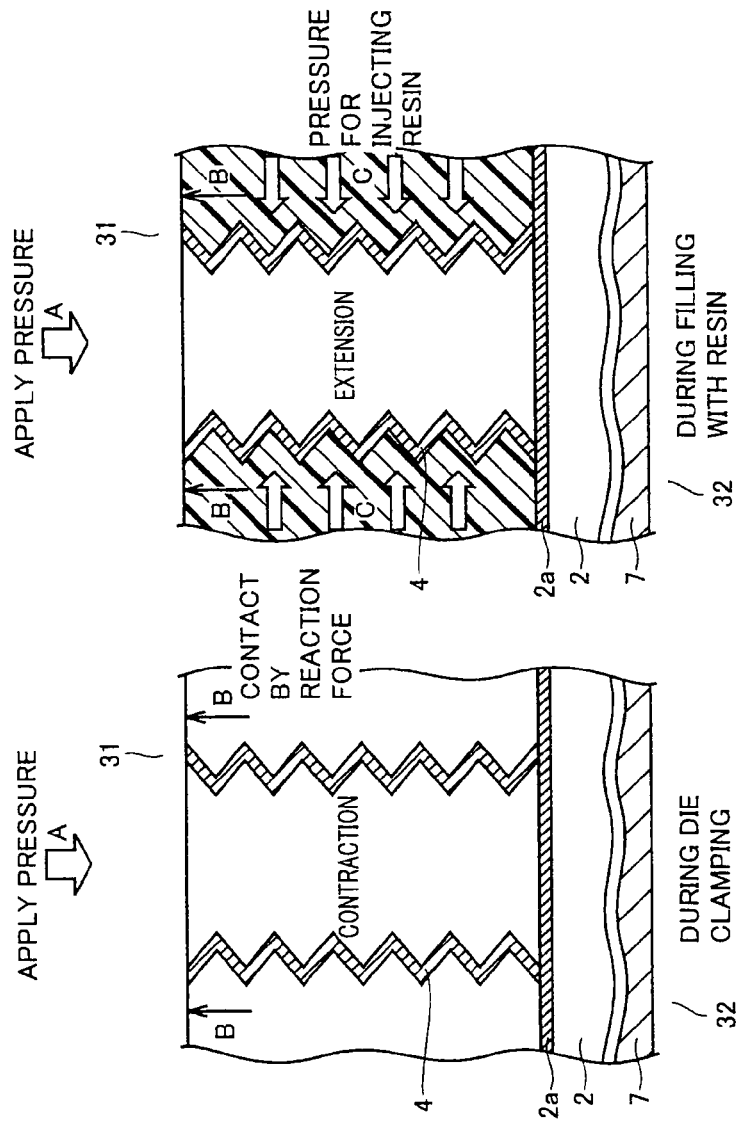

Referring to FIG. 7A, electrode 4 is not in contact with upper die 31 at the time of the setting in which electrode 4 solder-bonded to substrate 2 is set in the space (cavity) between upper die 31 and lower die 32. Accordingly, electrode 4 is not compressed.

Referring to FIG. 7B, at the time of die clamping in which upper die 31 and lower die 32 are clamped, upper die 31 and lower die 32 apply pressure in the direction indicated by an arrow A shown in the figure. This brings upper die 31 into contact with electrode 4, thereby causing contraction of electrode 4. In this state, since electrode 4 is contracted, electrode 4 tends to extend by elastic force in the direction opposite to the direction indicated by arrow A shown in the figure. Accordingly, electrode 4 is brought into contact with upper die 31 by the reaction force in the direction indicated by an arrow B in the figure which is caused by the elastic force.

Referring to FIG. 7C, at the time of filling with resin in which molten resin is injected into the space between upper die 31 and lower die 32, the pressure for injecting the resin is applied to electrode 4 in the direction indicated by an arrow C shown in the figure in the state where electrode 4 is pressurized and contracted in the direction indicated by arrow A in the figure. Consequently, electrode 4 tends to extend in the direction opposite to the direction indicated by arrow A shown in the figure. In other word, when electrode 4 is pressed by the injected resin in the direction indicated by arrow C shown in the figure, electrode 4 tends to extend in the direction orthogonal to the direction indicated by arrow C shown in the figure.

Accordingly, in addition to the reaction force in the direction indicated by arrow B shown in the figure caused by the elastic force, the pressure for resin injection applied in the direction indicated by arrow C in the figure causes electrode 4 to extend in the direction opposite to the direction indicted by arrow A shown in the figure that corresponds to the direction in which the pressure is applied. This brings electrode 4 into contact with upper die 31 by the force greater than that before application of the pressure for resin injection.

Furthermore, as shown in FIG. 7C, when electrode 4 has a shape of bellows, the injected resin serves to cause extension of the curves in the bellows, with the result that electrode 4 tends to extend with a strong force in the direction opposite to the direction indicated by arrow A shown in the figure. Consequently, electrode 4 is brought into contact with upper die 31 with a relatively strong force.

Then, the actions and effects of the semiconductor device according to one embodiment of the present invention will be described as compared with a comparative example.

Figure 8:
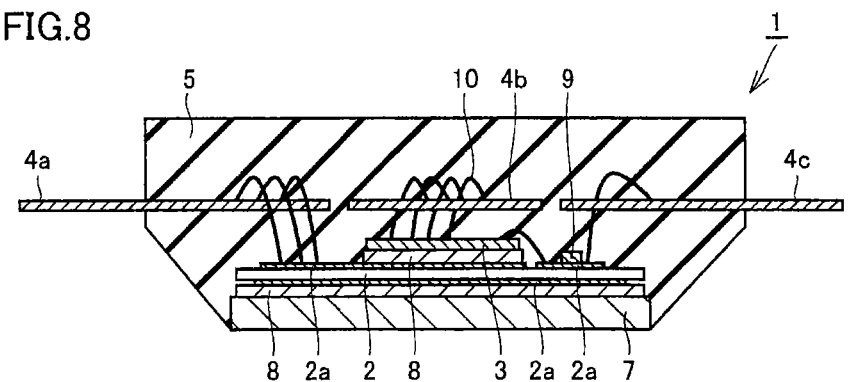
FIG. 8 is a conceptual diagram schematically showing the cross section of a semiconductor device in the comparative example.
Figure 9:
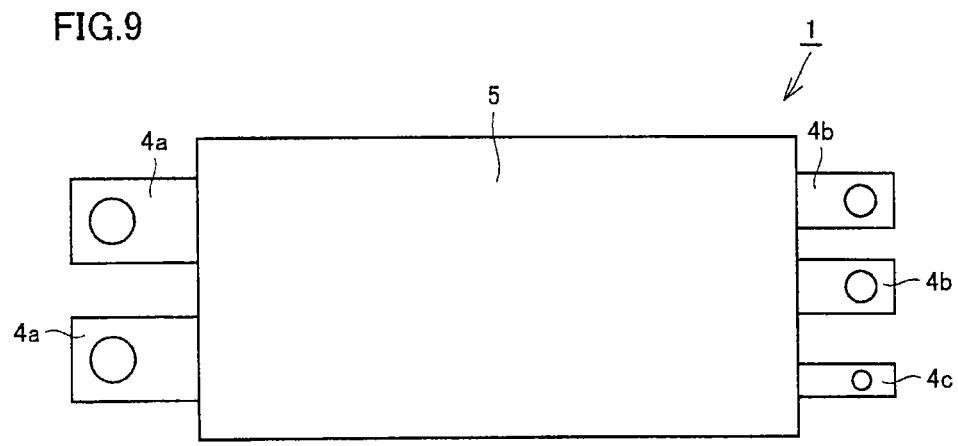
FIG. 9 is a conceptual diagram schematically showing the upper surface of the semiconductor device in the comparative example.

Referring to FIGS. 8 and 9, in the semiconductor device of the comparative example, C electrode 4a, E electrode 4b and G electrode 4c protrude from the side of semiconductor device 1. Accordingly, when a plurality of semiconductor devices 1 are arranged in parallel, other semiconductor devices 1 cannot be arranged in the space where these C electrode 4a, E electrode 4b and G electrode 4c are provided.

In contrast, according to semiconductor device 1 in one embodiment of the present invention, electrode 4 is configured to be extendable and contractible in the stacking direction in which substrate 2 and semiconductor chip 3 are stacked in the state before sealing of sealing resin 5. Consequently, extension and contraction of electrode 4 in the stacking direction allows absorption of the dimensional tolerance of substrate 2, semiconductor chip 3 or the like in the stacking direction. Furthermore, since electrode 4 is provided in the stacking direction, electrode 4 does not protrude from the side of the sealing resin to the outside. Therefore, semiconductor device 1 can be reduced in size.

In addition, electrode 4 does not protrude from the side of sealing resin 5 to the outside, which prevents occurrence of the unused area in which other semiconductor devices 1 cannot be disposed due to existence of electrode 4. Therefore, in the case where a plurality of semiconductor devices 1 are arranged in parallel, these semiconductor devices 1 can be arranged in a small space, which allows reduction in size of the system (product) having a plurality of semiconductor devices 1.

According to semiconductor device 1 in one embodiment of the present invention, electrode 4 may have curved contour portion 43 in a region which is in contact with sealing resin 5. Accordingly, in the state of sealing with sealing resin 5, since injected sealing resin 5 serves to cause extension of curved contour portion 43, electrode 4 tends to extend in the stacking direction with a relatively strong force. This brings electrode 4 into contact with upper die 31 with a relatively strong force. Consequently, the region in which edge 42a of the other end 42 of electrode 4 and upper die 31 are in contact with each other can be hermetically sealed with more reliability.

According to semiconductor device 1 in one embodiment of the present invention, one end 41 of electrode 4 is electrically connected to conductor 2a by solder bonding and may be configured to have a diameter which is reduced toward conductor 2a to edge 41a of one end 41. Consequently, solder 11 protrudes and extends to the outer periphery of one end 41, which allows solder-bonding to be readily carried out. Furthermore, the solder bonding area can be ensured, which allows improvement in the heat cycle performance.

According to semiconductor device 1 in one embodiment of the present invention, the other end 42 of electrode 4 may be configured to have a diameter which is increased toward opening 44 of hollow space 6 to edge 42a of the other end 42. Accordingly, relay terminal 22 can be readily inserted into electrode 4. Therefore, attachment of relay terminal 22 to electrode 4 can be readily carried out.

Furthermore, since the insertion amount of relay terminal 22 can be adjusted, the degree of freedom of the size of relay terminal 22 can be improved.

According to semiconductor device 1 in one embodiment of the present invention, electrode 4 may be configured to be extendable and contractible in the stacking direction by a force less than the bending strength of substrate 2 in the state before sealing of sealing resin 5. Accordingly, substrate 2 can be prevented from suffering defects such as cracks resulting from overload applied to substrate 2 by electrode 4. This allows extension and contraction of electrode 4 without causing any damage to substrate 2. Therefore, the properties of electrode 4 are ensured to allow improvement in the reliability.

According to semiconductor device 1 in one embodiment of the present invention, electrode 4 may be configured to prevent sealing resin 5 from flowing through opening 44 into hollow space 6 by the injection pressure at the time of sealing of sealing resin 5. Accordingly, the contact between edge 42a of the other end 42 of electrode 4 and upper die 31 can be ensured to prevent sealing resin 5 from flowing through opening 44 into hollow space 6.

Consequently, edge 42a of the other end 42 of electrode 4 and the inner peripheral side of electrode 4 can be prevented from being covered with sealing resin 5. Therefore, the conductivity of electrode 4 can be ensured. Furthermore, transfer molding can be readily carried out.

According to semiconductor device 1 in one embodiment of the present invention, sealing resin 5 may be sealed to attain the state where electrode 4 is compressed in the stacking direction within the elastic region. This leads to the state where electrode 4 is contracted in the stacking direction in the state of sealing of sealing resin 5, which allows reliable absorption of the dimensional tolerance of substrate 2, semiconductor chip 3 and the like in the stacking direction.

The method of manufacturing semiconductor device 1 in one embodiment of the present invention includes the following steps. Semiconductor chip 3 is disposed on substrate 2 having conductor 2a so as to be electrically connected to conductor 2a. Tubular electrode 4 which is extendable and contractible in the stacking direction in which substrate 2 and semiconductor chip 3 are stacked is also disposed such that one end 41 of electrode 4 is electrically connected to conductor 2a. When substrate 2, semiconductor chip 3 and electrode 4 are sandwiched between dies 31 and 32 from either side of the stacking direction, the other end 42 of electrode 4 is pressed by one of the pair of dies 31 and 32, thereby causing contraction of electrode 4 in the stacking direction. Sealing resin 5 is injected into the pair of dies 31 and 32, to seal substrate 2, semiconductor chip 3 and electrode 4 with sealing resin 5.

Thus, by sandwiching substrate 2, semiconductor chip 3 and electrode 4 between the pair of dies 31 and 32 from either side of the stacking direction, substrate 2, semiconductor chip 3 and electrode 4 can be sealed with sealing resin 5 in the state where electrode 4 is contracted in the stacking direction. Consequently, the dimensional tolerance of substrate 2, semiconductor chip 3 or the like in the stacking direction can be absorbed by causing extension and contraction of electrode 4. Furthermore, since electrode 4 is sealed in the stacking direction, electrode 4 does not protrude through the side of the sealing resin to the outside. Therefore, semiconductor device 1 can be reduced in size.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a substrate having a conductor;
   a semiconductor chip disposed on said substrate and electrically connected to said conductor;
   a tubular electrode having one end electrically connected to said conductor, said electrode having a length and being extendable and contractible along the length, said electrode including a bellows shape; and
   a sealing resin sealing said substrate, said semiconductor chip and said electrode, said sealing resin contacting the electrode along the length of the electrode and restricting movement of the electrode along the length of the electrode,
   an edge of an other end of said electrode being exposed from said sealing resin, and
   said electrode having a hollow space opened at the edge of said other end.

2. The semiconductor device according to claim 1, wherein said electrode has a curved contour portion in a region which is in contact with said sealing resin.

3. The semiconductor device according to claim 1, wherein:
   said one end of said electrode is electrically connected to said conductor by solder bonding, and
   said electrode has a diameter which is reduced toward said conductor to an edge of said one end.

4. The semiconductor device according to claim 1, wherein:
   said other end of said electrode has a diameter which is increased toward an opening of said hollow space to said edge of said other end.

5. The semiconductor device according to claim 1, wherein:
   said electrode is extendable and contractible along the length of the electrode by a force less than a bending strength of said substrate.

6. The semiconductor device according to claim 1, wherein:
   said electrode is a barrier along its length and prevents said sealing resin from flowing through said electrode into said hollow space.

7. The semiconductor device according to claim 1, wherein said sealing resin holds said electrode in a compressed state.

* * * * *